United States Patent [19]

Ong et al.

[11] Patent Number: 4,553,053
[45] Date of Patent: Nov. 12, 1985

[54] SENSE AMPLIFIER

[75] Inventors: Richard H. Ong, Phoenix; Peter C. Economopoulos, Scottsdale, both of Ariz.

[73] Assignee: Honeywell Information Systems Inc., Phoenix, Ariz.

[21] Appl. No.: 538,394

[22] Filed: Oct. 3, 1983

[51] Int. Cl.$^4$ .......................... H03K 5/24; G11C 7/06
[52] U.S. Cl. .................................... 307/530; 307/355; 307/362; 307/562; 365/190; 365/208
[58] Field of Search ............... 307/530, 355, 362, 493, 307/494, 562; 365/190, 207, 208, 205; 330/260

[56] References Cited

U.S. PATENT DOCUMENTS

| | | | |
|---|---|---|---|
| 3,444,472 | 5/1969 | Johnson | 365/207 X |
| 4,027,176 | 5/1977 | Heuber et al. | 365/208 X |
| 4,386,419 | 5/1983 | Yamamoto | 365/190 X |
| 4,401,901 | 8/1983 | Ochi | 307/475 X |

FOREIGN PATENT DOCUMENTS 0015070  9/1980  European Pat. Off. .................. 207/

Primary Examiner—Larry N. Anagnos
Attorney, Agent, or Firm—A. A. Sapelli; L. J. Marhoefer; J. S. Solakian

[57] ABSTRACT

A sense amplifier for a computer memory includes a plural stage differential amplifier. The first stage of the differential amplifier includes an input emitter follower connected to the input of the first stage differential pair. A negative feedback loop is connected around the first stage. The negative feedback loop enhances the response characteristic of the amplifier. Circuit means are also provided which enables the selective steering of energizing current through or away from the second stage of the differential amplifier to provide for the selective blocking of the output of the sense amplifier.

5 Claims, 9 Drawing Figures

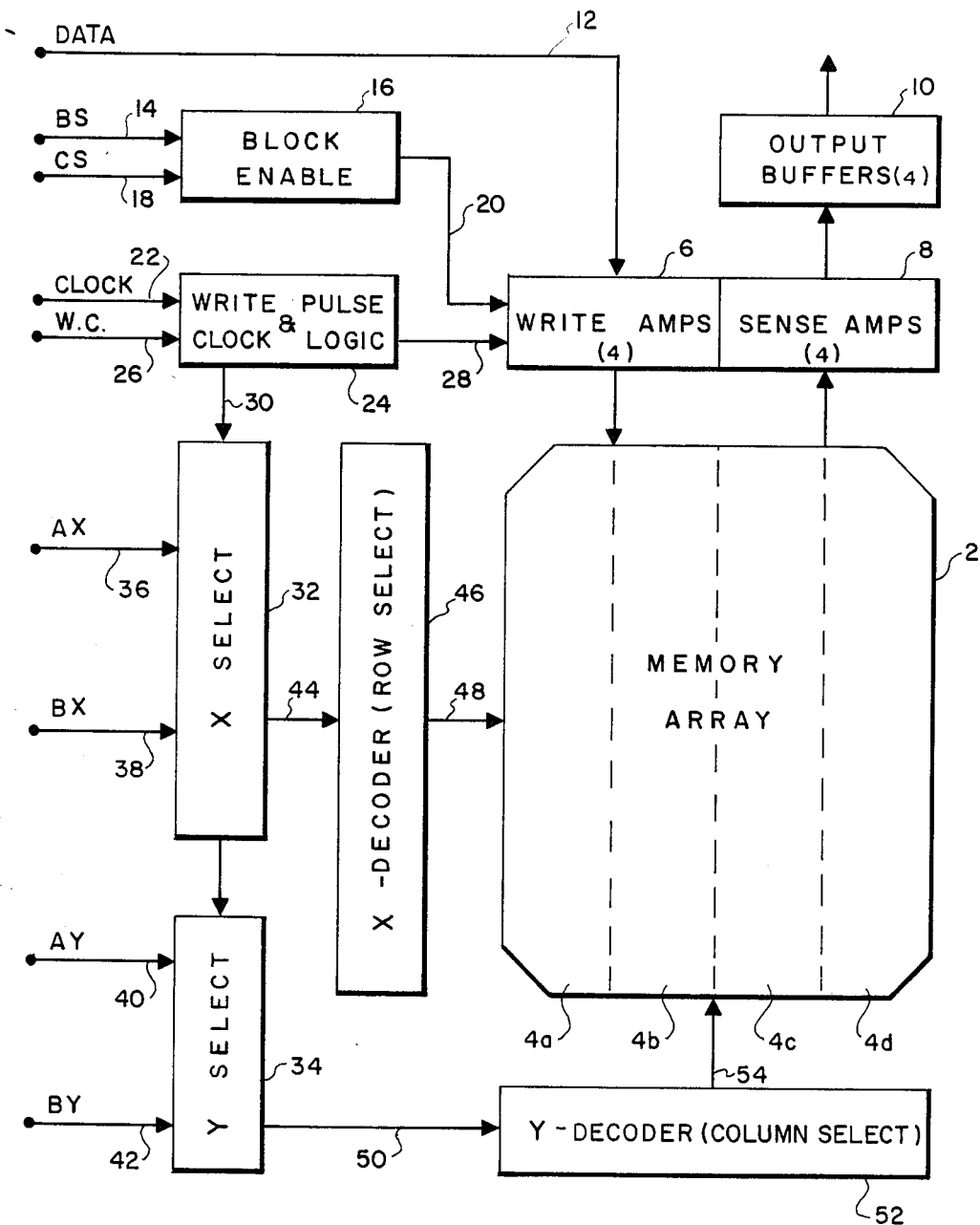
F I G. 1

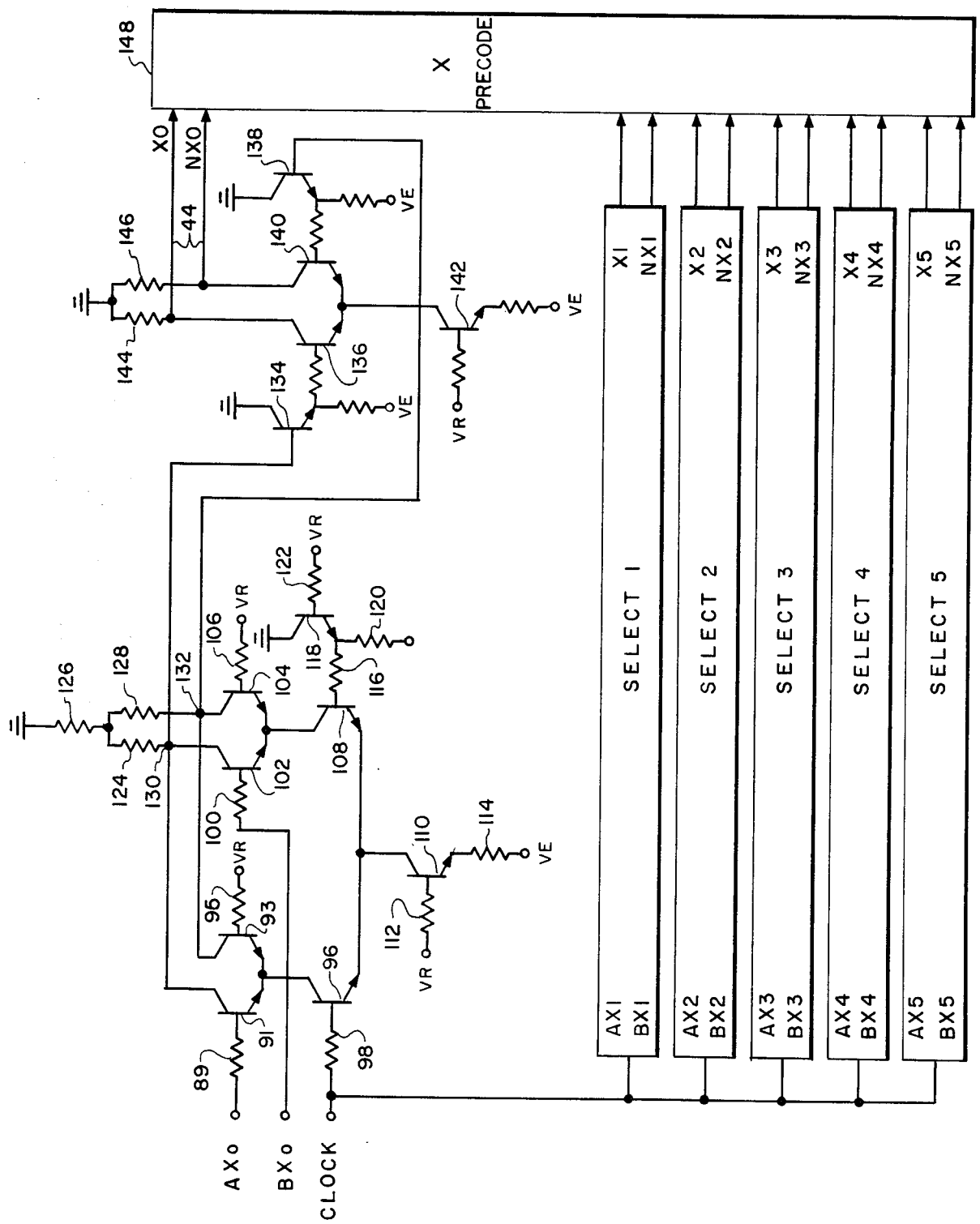
F I G. 3

SENSE AMPLIFIER

CROSS REFERENCES

1. Copending application of R. H. Ong, P. C. Economopoulos and R. W. Guenthner, Ser. No. 538,387, titled Dual Address RAM and filed on even date herewith.
2. Copending application of R. H. Ong and P. C. Economopoulos, Ser. No. 538,310 titled Write Amplifier and filed on even date herewith.

BACKGROUND OF THE INVENTION

The present invention relates to digital computer systems. More particularly, it relates to memory sense or read amplifiers for such computer systems.

In computer systems, there are numerous uses for random access memories (RAMs). For example, a computer system may include one or more central processor units (CPUs), each of which may include at least one cache memory. Cache memories are used as a temporary store for blocks of data most used by the associated CPU. They provide a rapid access to the stored data which otherwise must be manipulated by accessing the much slower main memory. In a co-pending patent application, referenced herein above, there is described a memory unit which may be accessed during each half cycle of the controlling clock signal.

A sense or read amplifier must be capable of sensing very small differential current signals and to convert those current signals into voltage signals of a magnitude suitable for use with CML output circuitry.

SUMMARY OF THE INVENTION

It is, accordingly, an object of the present invention to provide an improved sense amplifier for the memory of a computer system.

It is another object of the present invention to provide an improved sense amplifier as set forth which features an enhanced response characteristic.

In accomplishing these and other objects, there has been provided, in accordance with the present invention, a sense amplifier for a computer memory which includes a plural stage differential amplifier. The first stage of the differential amplifier includes an input emitter follower connected to the input of the first stage differential pair. A negative feedback loop is connected around the first stage. The negative feedback loop enhances the response characteristic of the amplifier. Circuit means are also provided which enables the selective steering of energizing current through or away from the second stage of the differential amplifier to provide for the selective blocking of the output of the sense amplifier.

BRIEF DESCRIPTION OF THE DRAWINGS

A better understanding of the present invention may be had from the following detailed description when read in the light of the accompanying drawings, in which:

FIG. 1 is a block diagram of a memory arrangement embodying the present invention;

FIGS. 3-8 are schematic diagrams illustrating various features of the structure shown in block form in FIGS. 1 and 2.

DETAILED DESCRIPTION

Figure 2A:
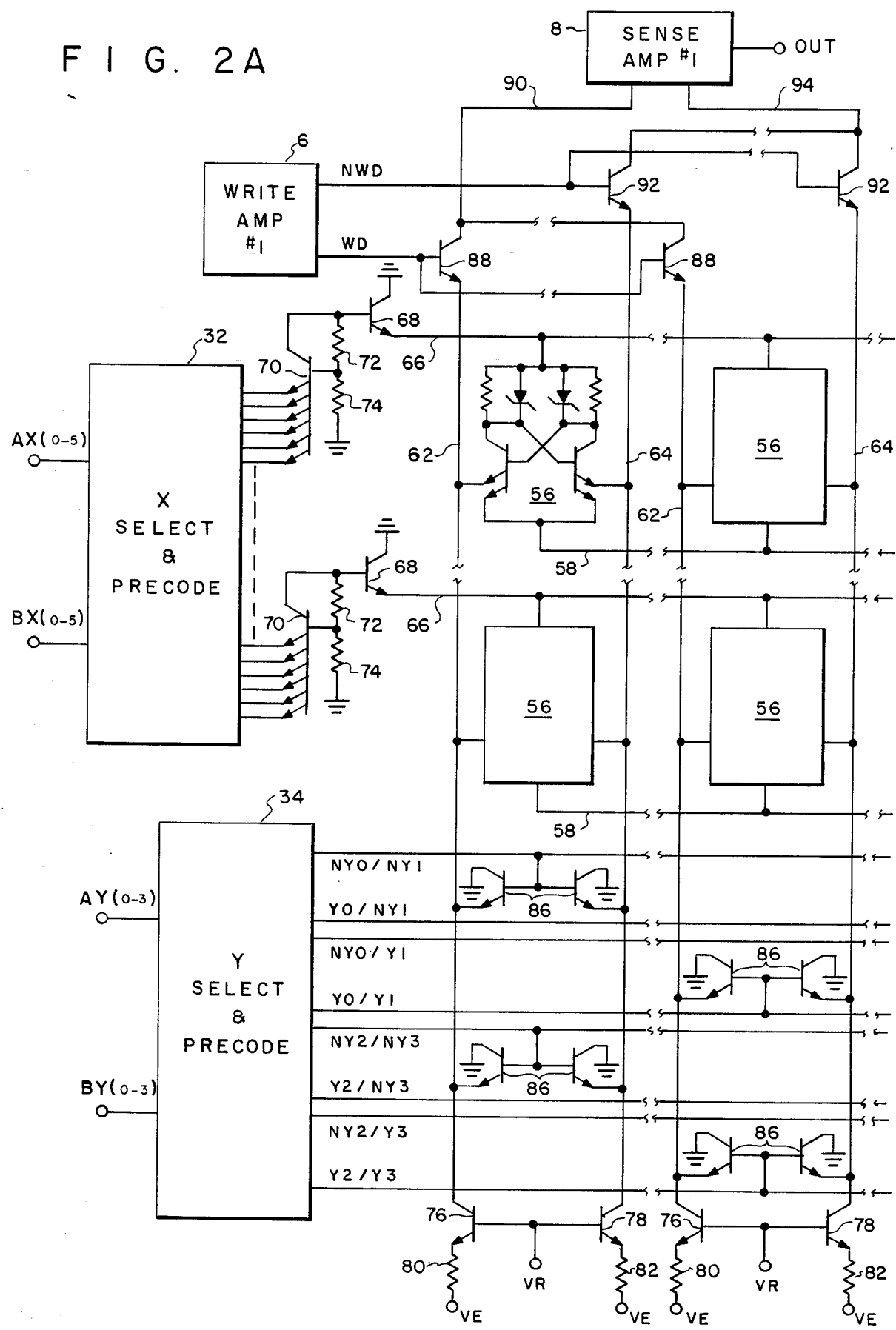
FIG. 2 is a partly block diagram, partly schematic diagram illustrating further details of the arrangement shown in FIG. 1.

Referring now to the drawings in more detail, there is shown in FIG. 1, a memory array 2. In an exemplary embodiment, the memory array 2 is comprised of four blocks 4a, 4b, 4c, 4d. The four blocks, of course, are by way of illustration and not as a limitation. A write amplifier 6 is representative of a plurality of write amplifiers corresponding in number to the number of blocks in the memory array. In the exemplary embodiment, there would be four such write amplifiers, one connected to write data into each of the four memory blocks, respectively. Similarly, a sense amplifier 8 is representative of a plurality of sense amplifiers corresponding in number to the number of blocks in the memory array 2. Again, in the exemplary embodiment, there would be four such amplifiers, one connected to each of the four blocks of the memory array, respectively. Each of the sense amplifiers 8 is connected, respectively, to an output buffer 10. The output of the buffers 10 comprise the memory-read output of the memory array 2.

Data signals for each of the write amplifiers, respectively, are supplied from the computer system, in well known ways, on a data line 12. Several control signals are supplied from the control sections of the associated computer in accordance with well known practices. For example, a block select signal is applied by way of an input line 14 to a block enable circuit 16. A chip-select signal is also input to the block enable circuit 16 by way of a line 18. As will be more fully described hereinafter, the chip select signal is ANDed with the block select signals to provide the block enable output signal which, in turn, is connected by a line 20 to control the enabling operation of the write amplifiers 6 and the sense amplifiers 8.

As is conventional in computer systems, there is provided a constantly running clock signal which is introduced into the present system by way of a line 22 connected to an input of a write-pulse and clock logic circuit 24. A second input to the circuit 24 is a clock control signal applied by way of a line 26. The clock control signal is a signal which is based upon the clock signal but is controlled by the computer to be not free running, that is, to be turned on or off in accordance with the demand of the computer. In the exemplary system, the clock-clontrol signal comprises a write command signal. The write pulse and clock logic circuit 24 includes timing means for producing an output write pulse on a line 28 which, in turn, controls the operation of the write amplifiers 6.

Another output from the write pulse and clock logic circuit 24 is a buffered clock output signal applied on a line 30 as an input to control the operation of an X-address select circuit 32 and a Y-address select circuit 34. The X-address select circuit has the X-component of a first address applied thereto from the terminal AX by way of a line 36. The X-address select circuit also has the X component of a second address applied thereto from the terminal identified as BX by way of a line 38. Similarly, the Y address select circuit has the Y component of a first address applied from the terminal AY by way of a line 40 and the Y component of a second address applied from a terminal by by way of a line 42.

The X select circuit 32 and the Y select circuit 34, as will be shown in more detail hereinafter, are controlled by the phase of the clock signal applied by way of the input line 30 to select either the A-address or the B-address components for selectively addressing the memory array 2. Thus, the X-select unit 32 will, in accordance with the phase control of the clock signal 30 select between the A-address or the B-address for the X-component of the addressing of the memory. The selected component is then transmitted to the X-decoder or row select unit of the memory array.

In the exemplary embodiment, each block 4 of the memory array 2 comprises a nominal 1K memory. To accommodate the 1K memory for each block of the memory array, each block is arranged in 64 rows of cells by 16 columns. When the X-decoder selects a particular row of the memory, the same row for all four blocks of the memory is selected. In a similar manner, the Y-select circuit 34, again under the control of the phase of the clock signal will select between the A and the B-address. The selected Y-component of the address is transferred by the interconnection 50 to the Y-decoder 52 or column select circuit. The Y-decoder, in the exemplary embodiment, selects one of sixteen possible columns in each of the four blocks of the memory array. The same column is selected in each of the four blocks. Thus, when a particular cell of the memory array in one block is selected, the same cell is selected simultaneously in the other three blocks.

By operation of the X and Y select circuits, in accordance with the phase of the clock signal on the line 30, the memory array 2 may be addressed twice during each cycle of the clock signal rather than once, as in previous circuit arrangements. In the exemplary embodiment, the X and Y select circuits are triggered by the leading edge of the clock cycle pulse. Thus, on the negative going edge of the clock pulse, the X and the Y select circuits 32 and 34 are triggered to select the B address input signals. In the exemplary embodiment, with a nominal 1K of memory in each addressed block of the memory array, there will be 10 bits in each address. Six of the bits would be designated for the X or row selection and four of the bits would be for the Y or column selection. At the positive going transition of the clock signal, the X and Y select circuits would be triggered to select the A-address bits. As will be seen hereinafter, it is only during the negative half cycle of the clock signal, during which time the B address input signals are selected, that data may be written into the memory. On the other hand, during either or both half cycles, the addressed memory positions may be read.

Figure 2B:
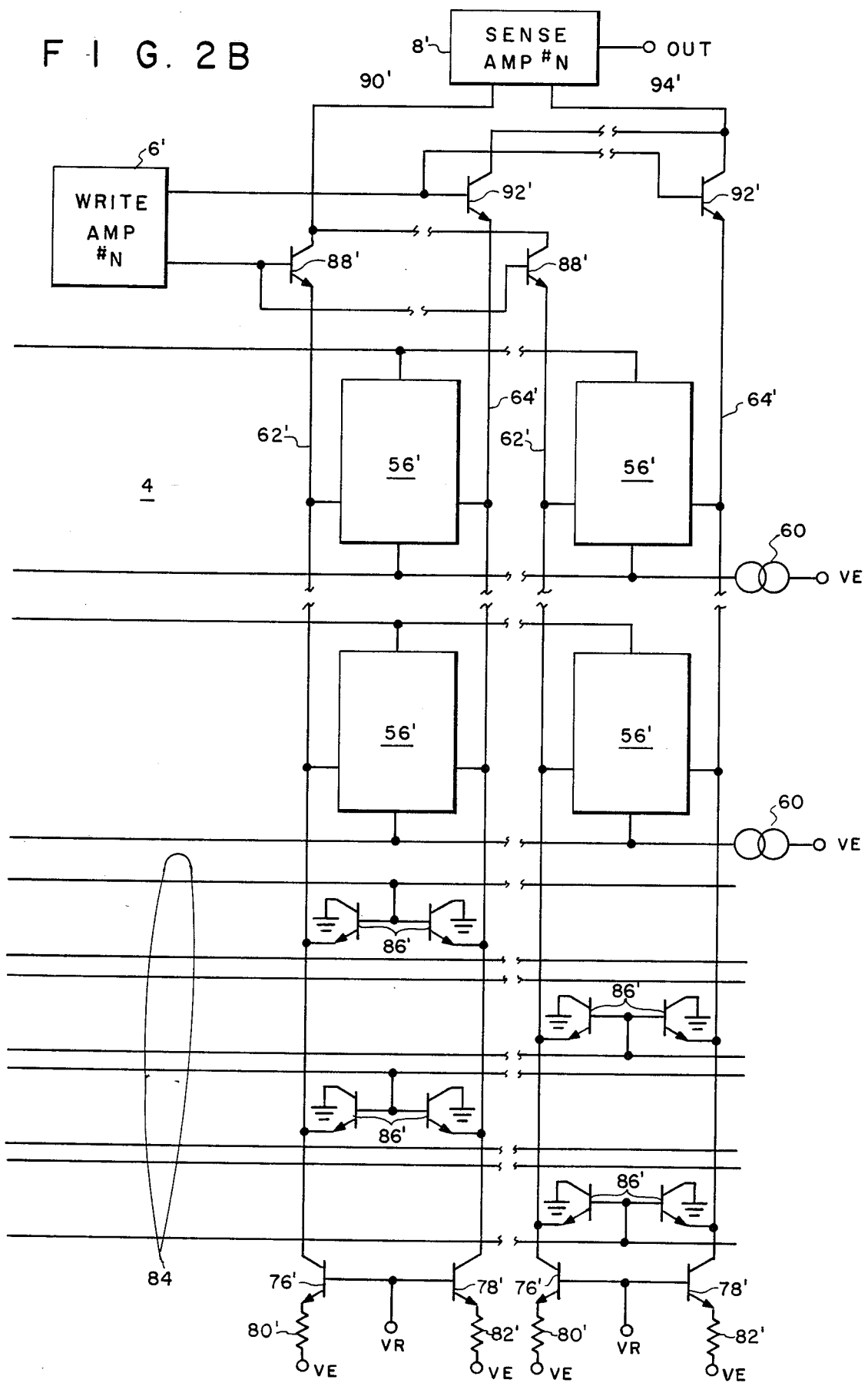

In the FIG. 2, the memory array 4 is illustrated as being in the form of a plurality of memory cells 56 each of the cells 56 is in the form of a conventional CML cross-coupled memory unit. Thus each cell includes a first and a second double emitter transistor having the base of the first transistor connected to the collector of the second transistor and the base of the second transistor connected to the collector of the first transistor. One emitter of the first transistor is connected directly to the corresponding emitter of the second transistor. The junction of the two emitters is connected to a standby constant current supply line 58 in common with all of the other cells in the same row. The line 58 is connected, in turn, through a constant current source 60 to an energy supply source VE. In the exemplary embodiment, the energy supply source VE was substantially at $-3.3$ volts. The second emitter of the first transistor is connected to a first bit line 62 while the second emitter of the second transistor is connected to a second bit line 64. The junction between the base of the second transistor and the collector of the first transistor is connected through the parallel arrangement of a load resistor and a Schottky diode to a row select line 66. Similarly, the junction between the base of the first transistor and the emitter of the second transistor is also connected by the parallel arrangement of a load resistor and a Schottky diode to the same row select line 66. Data is stored in the respective memory cells by having either the first or the second transistor conductive depending upon whether the stored data bit is a logical 1 or a logical 0.

While four memory cells 56 are illustrated, it will be appreciated that they are representative of a much larger number of cells representing a first block 4 in the memory array 2. As was previously noted, in the exemplary embodiment, each block of the memory array included 1,024 cells. These were arranged in 64 rows and 16 columns. Similarly, the memory cells 56' are representative of the memory cells in a further block 4 of the main memory array 2. This block also, in the exemplary embodiment, included 1,024 memory cells arranged in 64 rows and 16 columns. Further, in the exemplary embodiment, there are provided four such blocks of memory cells comprising the complete data array. Each block of the memory cells represents, thus, one data bit of a four-bit word stored in the memory.

Connected to each of the row select lines 66 is a transistor 68. The transistor 68 has its emitter connected directly to the line 66. The collector of the transistor is connected to ground while the base thereof is connected to a selective biasing circuit. The selective biasing circuit includes a multiple emitter transistor 70; in the illustrative embodiment, the transistor 70 has six emitters. The collector of the transistor 70 is connected directly to the base of the transistor 68. A resistive voltage divider, including a resistor 72 and a resistor 74, is connected between the base of the transistor 68 and ground. The junction between the two resistors is connected to the base of the transistor 70. The multiple emitters of all of the transistors 70 are connected, in a precoded arrangement, as will be more fully discussed hereinafter, to the X-select and precode circuit 32. The X-component of the A and B-address information is applied to the input of the X-select precode circuit 32. The transistor 68 for each of the rows of the memory array is biased to allow a very small current to flow at all times through the lines 66. That current then flows through the ON-side of the memory cell to the constant current line 58 through the constant current source 60 to the energizing voltage source VE. When one of the rows is selected, as will be more fully defined hereinafter, a larger current flows through the line 66 of the selected row.

In an analogous manner, the columns of cells are selected. Each of the bit lines 62 and 64 are supplied from a constant source represented, respectively, by the transistors 76 and 78. The transistors 76 and 78 have their respective emitters connected through load resistors 80 and 82 to a source of energizing voltage VE. The base of the transistor 76 is connected directly to the base of the transistor 78 and the junction thereof connected to a reference voltage source which establishes the level of the constant current flowing, respectively, through the transistors 76 and 78. The Y-component of the A and B-address is applied to the input of the Y-select and precode circuit 34, more about which will be said hereinafter. The output of the circuit 34 comprises a plurality of pairs of lines 84 which comprise the Y or column select lines. In the exemplary embodiment, there are provided four pairs of such lines. The circuit 34 will have selected between the A or the B address in accordance with the applied input clock signal. The pairs of Y-select lines 84 comprise a grid or matrix with respect to the bit lines 62 and 64. As will be seen from the discussion of FIG. 4, the output of each of the select circuits is a true $Y_o$ output and a complementary $Y_o$ output the first outputs being identified as Y0 and a NY0. Similar outputs are derived from the Y1, Y2, and Y3 signals. These signals are combined in a particular manner to provide the precoded signals on the lines 84 as illustrated. Pairs of selecting transistors 86 are connected to be gated ON through a connection to selected ones of the lines 84. For example, a first pair of transistors 86 have their base electrodes connected to a first one of the lines 84 designated NY0 and NY1. A second pair of the transistors 86 have their base electrodes connected to the line designated NY2 and NY3. The collector of the transistors 86 are connected to ground while the emitter of one of the transistor pairs 86 is connected to one bit line 62 and the emitter of the other of the pair of transistors 86 is connected to the bit line When the base electrodes of the pairs of transistors 86 connected to any pair of bit lines 62 and 64 are at a logical low, the column associated therewith is selected for either reading or writing as the case may be. By the various combination of the connection of the bases of the transistors 86 to different ones of the Y-select lines 84, with the four input address bits, any one of 16 columns can be selected or addressed. Thus when a particular column has been selected and a particular row in that column has been selected a single memory cell in each block has been identified and addressed. It will, of course, be appreciated that the same pattern of connections of the transistors 86 to the Y-select lines 84 will be repeated identically in each of the several blocks of the memory array. In this manner, the same memory cell in each of the several blocks will be selected for any given address.

Figure 6:
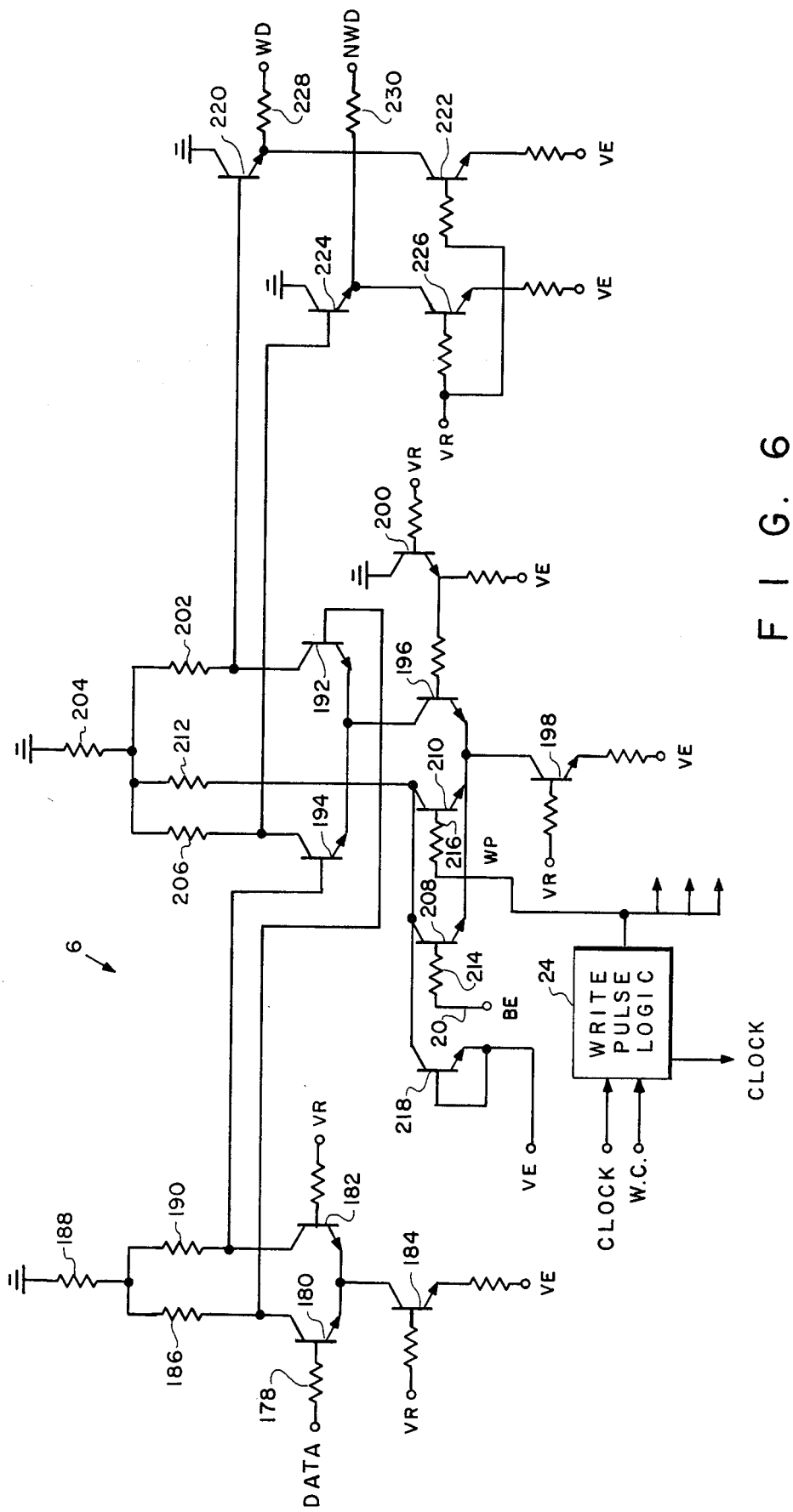

Each block of memory cells in the memory array has its own unique write amplifier 6. Each of the write amplifiers as will be more clearly shown in the discussion of FIG. 6, is arranged to provided a true output and a complementary output signal. In the exemplary embodiment, the true output is illustrated with the initials WD (write data) and the complementary output is designated NWD (not write data). The true or WD output of the write amplifier 6 is connected, in parallel, to the base electrodes of a plurality of sense switch transistors 88 connected, respectively, in series in each of the bit lines 62. Thus, in the exemplary embodiment, since there are 16 columns of memory cells, there will be 16 of the sense-switch transistors 88. Each of the transistors 88 has its emitter connected directly to the associated bit line 62. The collectors of the transistors 88 are all connected together and to a sense input line 90. The sense input line 90 comprises one input to a sense amplifier 8. Similarly, the complementary output or NWD line from the write amplifier 6 is connected, in parallel, to the base electrode of a second plurality of sense-switch transistors 92. Again, the sense-switch transistors 92 have their emitters connected, respectively, to corresponding ones of the bit lines 64. Here, too, the collector electrodes of the transistors 92 are connected together and through a second sense input line 94 to the second input of a sense amplifier 8. The output of the sense amplifier 8 represents the sensed status of the addressed and selected memory cell in the associated memory block. As noted each block in the memory array also has its own sense amplifier. Therefore, the composite of the signals from the several sense amplifiers comprise the data word extracted from memory. In the exemplary embodiment, with four blocks to the memory array and, accordingly, four sense amplifiers, the output data word would be a four bit word. With a nominal 1,000 memory cells in each block, the content of the memory array in the exemplary embodiment is 1,000 four-bit words.

In the FIG. 3 there is shown a schematic arrangement for the X-select circuit arrangement for selecting the X-component of the A or B address in accordance with the clock signal. As was mentioned in connection with FIG. 1, each of the A or B address signals comprise a 10-bit word. Six of the bits are identified in the exemplary embodiment as the X-components while the remaining four are identified as the Y-components for identifying a particular cell in each of the blocks of the memory array. Thus, there is shown in FIG. 3 six individual select circuits which are identical in structure. Accordingly, one such circuit is shown in detail, the remaining five are shown as individual blocks. The circuit arrangements for the least significant bit of the X-component of either the A or B-address is again arranged in the negative logic arrangement of the current mode logic circuitry.

The $AX_0$ bit is supplied to an input terminal and through a resistor 89 to the base electrode of a transistor 91. The transistor 91 is one transistor of a differential amplifier pair, the other transistor of which is the transistor 93. The transistor 93 has its base electrode connected through a resistor 95 to a voltage reference source. The emitter electrodes of the transistors 91 and 93 are connected together and to the collector electrode of a transistor 96. The transistor 96 has its base electrode connected through a resistor 98 to a clock signal input terminal. The $BX_0$ input signal is applied through a resistor 100 to the base electrode of a transistor 102. Again, the transistor 102 is one of a differential amplifier pair of transistors, the other of which is the transistor 104. The transistor 104 has its base electrode connected through a resistor 106 to a voltage reference source. The emitters of the transistors 102 and 104 are connected together and to the collector electrode of a transistor 108. The emitter of the transistor 96 and the emitter of the transistor 108 are connected together and to the collector electrode of a transistor 110. The transistor 110 has its base electrode connected through a resistor 112 through a source of reference voltage. The emitter of the transistor 110 is connected through a resistor 114 to a source of energizing voltage. The transistor 108 has its base electrode connected through a resistor 116 to a controlled reference potential. The source of controlled reference potential comprises, in turn, a transistor 118 having its collector connected to ground, its emitter connected through a resistor 120 to a source of energizing voltage VE, and its base electrode connected through a resistor 122 to a source of fixed reference voltage. The resistor 116 is connected to the junction between the emitter of the resistor 118 and the resistor 120.

It will be noted that the transistor 110 comprises a constant current source for the differential amplifier circuitry set forth hereinbefore. The transistors 96 and 108 are connected differentially and comprise a steering switch, responsive to the phase of the clock signal to direct the current flow, controlled by the transistor 110 through the differential amplifier associated with the AX signal or the differential amplifier associated with the BX signal. The collector of the transistor 104 and the collector of the transistor 102 are connected together and through a resistor 124 and a resistor 126, to ground. The collector of the transistor 93 and the collector of the transistor 104 are connected together and, through a resistor 128 and the resistor 126, to ground.

Thus, it may be seen that the transistor 91 and the transistor 93 comprise a differential amplifier for the $AX_0$ signal and the transistor 102 and 104 comprise a differential amplifier for the $BX_0$ signal. The AX differential amplifier defines its current flow path through the steering transistor 96 to the constant current source defined by the transistor 110. Similarly the B differential amplifier defines its current path through the steering transistor 108 to the constant current source 110. The transistor 118 and its associated circuitry is arranged to provide an appropriate bias level for the reference signal at the base of the transistor 108 at a level which is substantially at midpoint of the voltage level swing of the clock pulse applied to the base of the transistor 96. In the exemplary embodiment, the original clock pulse had a logical high at 0 volts and a logical low at $-0.5$ volts. Since, however, the clock pulse is passed through a transistor emitter follower circuit in the write pulse and clock logic circuit 24, the clock pulse at the input to the circuit illusrated in FIG. 3 now has a logical high at $-0.8$ volts and a logical low at a $-1.3$ volts. Accordingly, the reference voltage applied to the base of the transistor 108 is established at $-1.05$ volts. In this manner, it may be seen, that when the clock pulse applied to the base of the transistor 96 is at a logical high, the current path from the constant current source 110 will flow through the transistor 96 and its associated circuitry while the transistor 108 is in a cut off condition. Conversely, when the clock signal applied to the base of the transistor 96 goes to a logical low, the current path therethrough is cut off and the current path from the constant current source 110 flows through the transistor 108 and its associated circuitry.

Since the differential amplifier associated with the transistor 96 is the AX address signal, when the transistor 96 is conductive it is the A address signals which are selected. Again, conversely, since the differential amplifier associated with the transistor 108 is the BX address signal, when the transistor 108 is conductive it is the B address signal which is selected. In the exemplary embodiment, the A and B address signals are defined as a logical high at 0 volts and a logical low at $-0.5$ volts. Accordingly, the reference voltage VR applied to the transistors 93 and 104, respectively, is established at $-0.25$ volts. Thus, when a logical high is input at either the AX or the BX input terminals, depending upon which differential amplifier is enabled, there will appear a logical low at the junction 130 and a corresponding logical high at the junction 132. On the other hand, if a logical low is input at either the AX or the BX terminal, again depending on which of the differential amplifiers is enabled, there will be a logical high at the junction 130 and a correlative logical low at the junction 132.

The output junctions 130 and 132 are connected to corresponding input terminals of an output differential amplifier. Specifically, the junction 130 is connected to the base electrode of an emitter follower transistor 134 the output of which is connected to the base electrode of a transistor 136 forming one-half of the output differential amplifier. The junction 132 is connected to the base electrode of an emitter follower 138 the output of which is connected to the base electrode of a transistor 140 forming the other half of the differential amplifier. The emitters of the transistors 136 and 140 are connected together and to the collector electrode of a transistor 142 comprising a constant current source. The collector of the transistor 136 is connected through a resistor 144 to ground while the collector of the transistor 140 is connected through a resistor 146 to ground.

The true output of the output differential amplifier is taken at the junction between the collector of the transistor 136 and the resistor 144. Similarly the complementary output of the output differential amplifier is taken at the junction between the collector of the transistor 140 and the resistor 146. These two output leads correspond to the leads 44 illustrated in FIG. 1 between the X select unit 32 and the X decoder or row select arrangement 46. With respect to the least significant bit, the $X_0$ bit, the true lead is designated $X_0$, the complementary lead is designated $NX_0$. Again, the $X_0$ or the $NX_0$ signals will be derived from the A or the B address signal depending upon the phase of the clock signal. In the exemplary embodiment it was noted that there are six bits to the X component of the address signal. Accordingly, there are six select circuits indentical to the $X_0$ select circuit just described. These are designated select 1, select 2, select 3, select 4 and select 5. These select circuits respond, respectively, to the $AX_1$ and $BX_1$ through the $AX_5$ and $BX_5$ bits of the address signal. Each of the select circuits 1 through 5 also provide a true and a complementary output as illustrated. The 12 output lines from the six select circuits are applied as input to an X precode and decode circuit 46.

Figure 4:
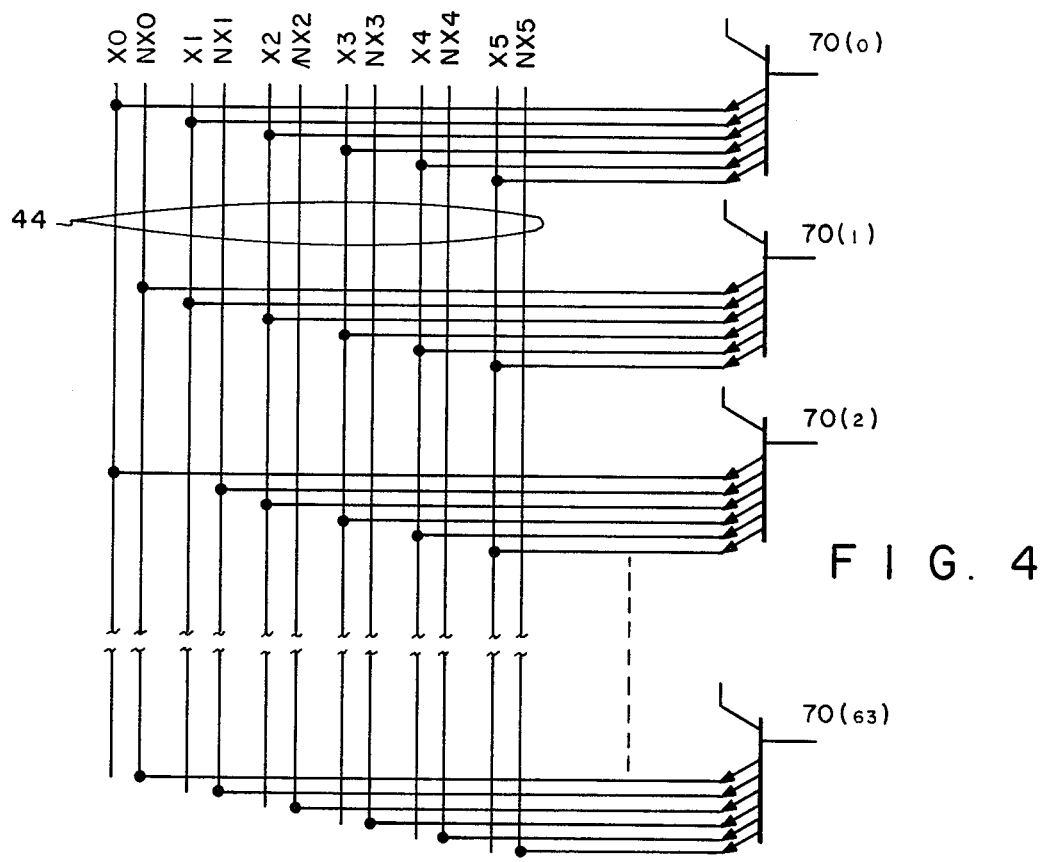

The structure of the precode and decode circuit 46 is illustrated in FIG. 4. The decode element is, of course, the several transistors 70 shown in FIG. 2. Each of the transistors 70 includes six emitters. The six emitters of the transistors 70 are connected, respectively, to a different combination of the leads 44 thereby producing, in the exemplary embodiment, 64 uniquely selected outputs from the several transistors 70. For any given six-bit address applied to the X-select and decode circuit, only one of the transistors 70 will have a logical high applied to all six of the emitters. The logical high on all six of the emitters of the particular transistor results in a maximum current flow in the row select line 66 associated therewith. That line 66 is thereby uniquely selected to enable the memory cells in the row thus designated. Thus, any given six bit address applied to the input terminals of the select circuits will uniquely select one of the 64 row select lines 66 (FIG. 2).

Figure 5:
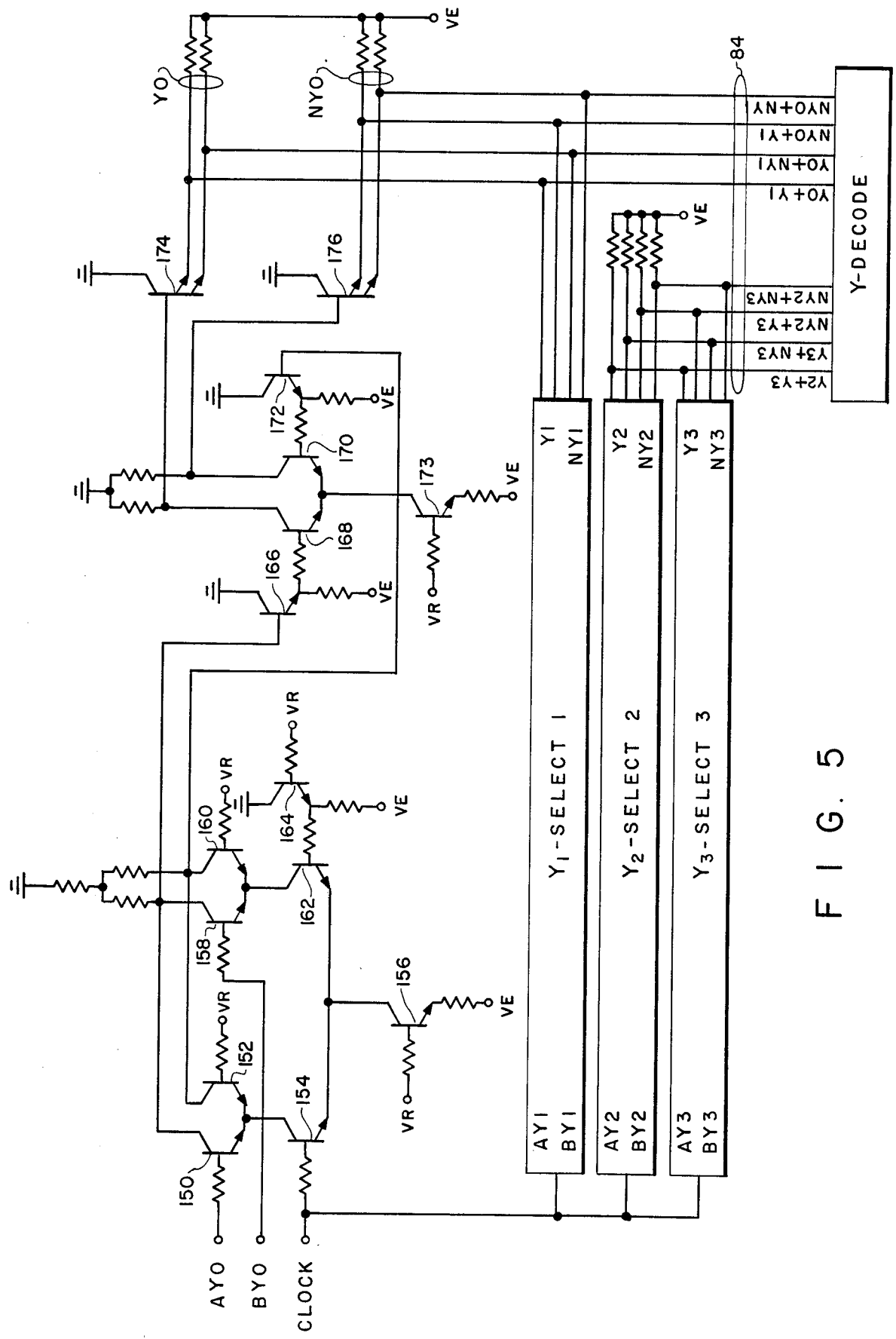

In FIG. 5 there is shown a Y select and precode circuitry 34 shown in block diagram form in FIG. 2. The Y select circuit which selects the Y components of either an A or a B address signal is substantially identical to the select circuit for the X component signals. As was hereinbefore noted, the Y components of the address signal, in the illustrative embodiment, is a four-bit signal. Again, in FIG. 5 the select circuit for the least significant bit $Y_0$ is illustrated in detail while the select circuits for bits 1, 2 and 3 are illustrated in block diagram form. Here, too, the $AY_0$ signal is applied to the input at the base of a transistor 150 which, together with a transistor 152 comprises a differential amplifier. The emitter electrodes of the transistors 150 & 152 are connected together and, through a steering transistor 154, to a constant current circuit controlled by a transistor 156. Similarly, the $BY_0$ signal is applied as an input signal to the base electrode of a transistor 158 which together with the transistor 160 comprise a differential amplifier. The emitter electrodes of the transistors 158 and 160 are connected together and, through a steering transistor 162, to the current source controlled by the transistor 156. As in the circuit of FIG. 3, the steering transistor 152 has an appropriate reference bias applied thereto from a reference signal circuit which includes the transistor 164. The clock signal is applied to the base input terminal of the transistor 154 where it is compared with the reference signal applied to the base electrode of the transistor 162. Here, again, the phase of the clock signal will determine which of the two differential amplifiers, the A differential amplifier or the B differential amplifier, will be enabled. The collector electrode of the transistor 150 is connected to the collector electrode of transistor 158 and to the base electrode of the emitter follower transistor 166. The output of which is connected to the input of the transistor 168. The transistor 168 together with a transistor 170 form a differential output amplifier. The collector of the transistor 152 is connected to the collector of the transistor 160 and to the base input of an emitter follower transistor 172.

The output of the emitter follower 172 is connected to the input of the transistor 170. The output of the transistor 178 comprises the true output of the $Y_0$ signal. This is applied to the base input of a dual emitter, signal splitting transistor 174. The output of the transistor 170 comprises the complementary output of the $Y_0$ signal and is applied to the base input of a dual emitter, signal splitting transistor 176. The signal on both of the emitters of the transistor 174 are designated $Y_0$, being the true output of the select circuit for the $Y_0$ signal, whether it be the A or the B address signal. Similarly, the output on both of the emitters of the transistor 176 are designated $NY_0$, being the complementary output signal of the $Y_0$ select circuit, again, whether it be the A or B address signal.

In a like manner, the output of each of the select circuits, select 1, select 2, and select 3 provide two true output signals and two complementary output signals. The several output signals of the $Y_0$ select circuits are selectively ANDed with the output signals from the $Y_1$ select circuit to produce four precoded signal lines, as illustrated. Similarly, the output signals from the $Y_2$ select circuit are selectively ANDed with the output signals from the $Y_3$ select circuit to produce another four precoded signal lines as indicated. The resulting eight precoded lines comprise the Y select or column select lines 84 illustrated in FIG. 2.

FIG. 6 is a schematic diagram of a preferred embodiment of a write amplifier such as is shown in FIGS. 1 and 2 in block diagram form. It will be remembered, of course, that there is a separate write amplifier for each block of the memory array. Thus, in the exemplary embodiment, with four blocks in the memory array, there will be four write amplifiers, each, respectively, representing one bit of the four-bit data word in the memory array.

In the write amplifier, data signals are applied through an input resistor 178 to the base electrode of a transistor 180. The transistor 180 together with a transistor 182 comprise a differential amplifier input stage. The emitters of the transistors 180 and 182 are connected together and to a constant current source controlled by a transistor 184. The collector of the transistor 180 is connected through a load resistor 186 and a resistor 188 to ground. Similarly the collector of the transistor 182 is connected through a load resistor 190 and the resistor 188 to ground.

The output of the transistor 180, taken at the collector electrode thereof, is connected to the base electrode of a transistor 192. The transistor 192 together with a transistor 194 comprise a second-stage differential amplifier. The emitters of the transistors 192 and 194 are connected together and through a steering transistor 196 to a constant current source controlled by a transistor 198. A constant bias signal is applied to the base electrode of the transistor 196 from the output of an emitter follower transistor 200. The output of the transistor 182, taken at the collector electrode thereof, is connected to the base electrode of the transistor 194 of the second-stage differential amplifier. The collector of the transistor 192 is connected through load resistor 202 and a resistor 204 to ground. The collector of the transistor 194 is connected through a load resistor 206 and the resistor 204 to ground.

A block enable transistor 208, connected in parallel with a write enble transistor 210, have their collectors connected together and through a resistor 212 and the resistor 204 to ground. The transistors 208 and 210 together or separately form a differential amplifier or comparator with respect to the steering transistor 196. Thus, the collector of the transistor 208 the collector of the transistor 210 and the collector of the transistor 196 are connected together and to the constant current source represented by the transistor 198.

For any of several reasons, the computer may elect to disable one or more of the blocks in the memory array. To this end, a block enable signal is applied to the line 20 connected through a resistor 214 to the base of the transistor 208. The block enable signal is derived from a circuit which will be described in connection with FIG. 8. When the signal at the base of the transistor 208 is at a logical high, that signal is compared with the reference signal applied to the base electrode of the transistor 196. When the signal at the base of the transistor 208 is at a logical high, the current controlled by the constant current resistor is steered from the ground terminal through the resistor 204 the resistor 212 and the transistor 208. Thus, no current flows through the transistor 196. When no current flows through the transistor 196, then no current will flow through either the transistor 192 or 194. With no current flowing through the transistors 192 or 194, the amplifier does not respond to input signals.

When it is desired to write data into memory, the computer issues a write command signal (WC) which is applied as one input signal to a write pulse logic 24 to which reference was made in connection with FIG. 1. A clock signal is also applied as an input signal to the logic circuit 24. In order that the addressing circuits may have been stabilized before the write pulse is applied, the write command signal is delayed in the write pulse logic 24 and ANDed with the clock signal to provide an output write pulse signal (WP). The write pulse signal is applied through a resistor 216 to the base electrode of the transistor 210. The write pulse is also applied in a similar manner to the other three write amplifiers associated with the memory array. While the write pulse remains at a logical high, current is drawn through the resistor 204, the resistor 212, the transistor 210 to the constant source controlled by the transistor 198. Thus, the current is steered away from the transistor 196. When the write pulse goes from a logical high to a logical low, the transistor 210 is cut off and, assuming the transistor 208 is also cut off, current will then be drawn through the transistor 196 and hence through the transistors 194 and 192, depending upon the applied signal from the input differential amplifier.

A transistor 218 has its collector electrode connected to the collector electrodes of the transistors 208 and 210. The base and emitter electrodes are tied together and to an energizing source. This transistor 218 is connected to serve as a filter capacitor for switching transients that may occur during the switching of the steering current from the transistors 208 and 210 to the transistor 196. The capacitance of the transistor 218 co-operates with the resistor 212 to provide a smoothing effect on the filtering action to prevent spurious transient signal incident to switching, from causing incorrect data to be written to the memory or from causing an incorrect read reference voltage.

The output of the transistor 192 is taken at the collector electrode thereof applied as an input signal to the base electrode of an output emitter follower amplifier 220. The emitter of the transistor 220 is connected to a constant current source controlled by a transistor 222. Similarly, the output of the transistor 194 is taken at the collector thereof and applied to the base of an emitter follower transistor 224. The transistor 224 has its emitter electrode connected to a constant current source controlled by the transistor 226. The true output of the write amplifier is taken at the emitter of the transistor 220 through a resistor 228 to the write data (WD) line. The complementary output of the write amplifier is taken at the emitter of the transistor 224 and transmitted through transistor 230 to the write data (NWD) line. With reference to FIG. 2, it may be seen that the true output or write data line is connected to the base electrode of the sense switch transistors 88. On the other hand, the complementary or NWD line is connected to the base electrodes of the sense switches 92.

Assuming that the block enable signal is at a logical low, rendering the write amplifier enabled, while the write pulse signal is at a logical high, the transistor 210 is conductive and the transistor 196 is non-conductive. Under those circumstances, the differential amplifier comprising the transistors 192 and 194 is insensitive to input data signals. With those two transistors being non-conductive there is a logical high at both the true and the complementary output of the write amplifier. That is, a logical high is applied to both the WD and the NWD lines. Under such conditions, the read amplifier, to be described in detail hereinafter, may read a status of the selected or addressed memory cell in the associated block of the memory array. When the write pulse applied to the base electrode of the transistor 210 shifts to a logical low, that transistor becomes non-conductive while the transistor 196 becomes conductive, thereby enabling the differential amplifier including the transistors 192 and 194. With that differential amplifier enabled, the status of that differential amplifier will be determined by the nature of the signal applied to the input differential amplifier comprising the transistors 180 and 182. If the signal input at the transistor 180 were a logical high relative to the reference signal applied to the base of the transistor 182, then transistor 180 becomes conductive and transistor 182 becomes non-conductive. That results in the transistor 194 becoming conductive and the transistor 192 becoming non-conductive. This results in a logical high at the true output on the line WD and a logical low at the complementary output NWD. On the other hand, if the data signal applied to the input of the transistor 180 were at a logical low relative to the reference signal applied to the transistor 182 the situation would be reversed and a logical low would be applied to the true output on the line WD and a logical high on the complementary output NWD.

Figure 7:
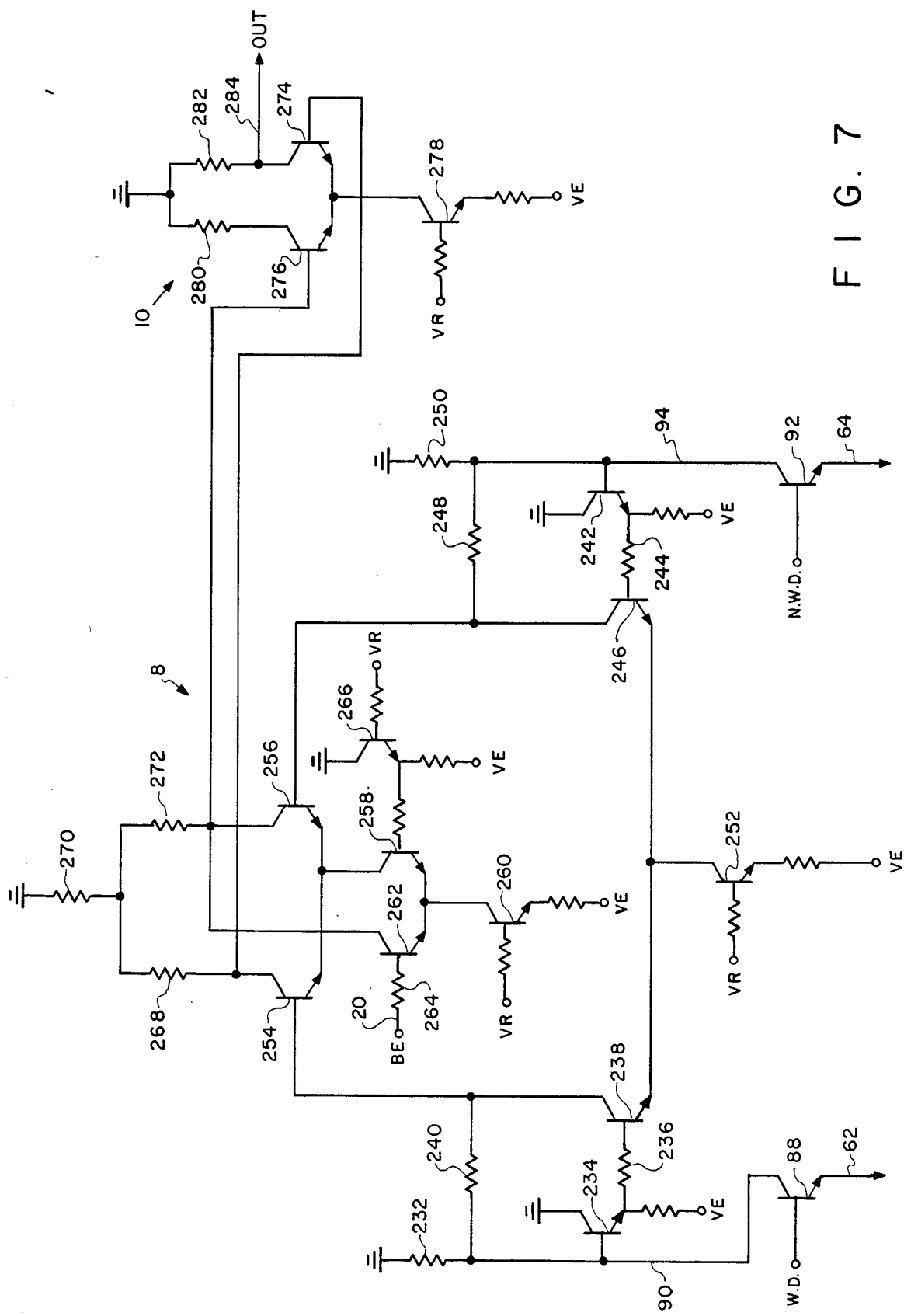

In FIG. 7 there is illustrated in schematic diagram form a preferred embodiment of the sense amplifier 8 shown in FIGS. 1 and 2 in block diagram form. As previously noted, the bit line 62 is connected to the emitter of the sense-switch transistor 88. The true output of the write amplifier or write data line is connected to the base electrode 88. The collector of the transistor 88 is connected to the line 90; all as shown in FIG. 2. The line 90 is connected through a resistor 232 to ground. The line 90 is also connected to the base electrode of an emitter follower transistor 234. The emitter of the transistor 234 is connected through a coupling resistor 236 to the base electrode of a transistor 238. The collector of the transistor 238 is connected through a feedback resistor 240 to the base electrode of the transistor 234.

Similarly, the bit line 64 is connected to the emitter electrode of the sense-switch transistor 92. The complementary or write data line is connected to the base electrode of the transistor 92. The collector of the transistor 92 is connected to the line 94; all, again, as shown in FIG. 2. The line 94 is connected to the base electrode of an emitter follower transistor 242. The emitter of the transistor 242 is connected through a coupling resistor 244 to the base electrode of a transistor 246. The collector of the transistor 246 is connected through a feedback resistor 248 to the base electrode of the transistor 242. The base electrode of the transistor 242 is also connected through a resistor 250 to ground.

The transistors 238 and 246 comprise a first-stage differential amplifier and have their emitters connected together and to a constant current source controlled by the transistor 252. The output of the transistor 238 is taken at the collector thereof and is connected to the base electrode of a transistor 254. Similarly the output of the transistor 246 is taken at the collector electrode thereof and is connected to the base electrode of the transistor 256.

The emitters of the transistors 254 and 256 are connected together and through one transistor 258 of a differential steering transistor pair, to a constant current source controlled by a transistor 260. The other transistor of the steering pair is the transistor 262 which has its emitter connected to the emitter of the transistor 258 and to the constant current source controlled by the transistor 260. The block enable signal is applied through a coupling resistor 264 to the base electrode of the transistor 262. A fixed reference signal is applied to the base electrode of the transistor 258 and is controlled by a constant signal transistor 266. The collector of the transistor 258 is connected to the emitter electrodes of the transistors 254 and 256. The collector of the transistor 254 is connected through a resistor 268 and a resistor 270 to ground. Similarly, the collector of the transistor 256 is connected through a load resistor 272 and the resistor 270 to ground. The collector of the transistor 262 is connected to the junction between the resistor 272 and the collector of the transistor 256.

The output of the transistor 254 is taken at the collector electrode thereof and applied as an input signal to the base electrode of a transistor 274. Similarly, the output of the transistor 256 is taken at the collector electrode thereof and applied as input signal to the base of a transistor 276. The transistors 274 and 276 comprise an output buffer amplifier 10 and have their emitters connected together and to a constant current source controlled by the transistor 278. The collector electrode of the transistor 276 is connected through a resistor 280 to ground while the collector of the transistor 274 is connected through a load resistor 282 to ground. The output of the output buffer 10 is taken at the junction between the collector electrode of the transistor 274 and the resistor 282 and is applied on an output lead 284.

With reference, for the moment, to FIG. 6, the parameters of the write amplifier in the exemplary embodiment, are such that a logical high on either the WD output line or the NWD output line is substantially −1.065 volts. On the other hand, a logical low at either of the output lines WD or NWD is substantially −1.865 volts. Thus when both the WD and the NWD signal are at a logical high, no data can be written into memory cells 56. However, the application of the two logical high signals to the base electrodes of both of the sense switch transistors 88, 92 allow the sense amplifier to respond to the differential signals which will result from the data bit status of the selected memory cell 56. This, of course, assumes that the block enable signal applied to the base of the transistor 262 is at a logical low.

As before, the block enable signal in the exemplary embodiment shifts between a logical high at −0.8 and a logical low at −1.3 volts. The reference voltage applied to the base of the transistor 258, again, in the exemplary embodiment, is established at −1.05 volts. Thus, when the block enable signal is at its logical low or −1.3 volts, the voltage is compared with the reference signal at −1.05 volts and the current controlled by the constant current source 260 is steered through the transistor 258 to the differential amplifier comprising the transistors 254 and 256. with the current thus steered through the differential amplifier, that differential amplifier is enabled to respond to the aforementioned differential signal from the bit lines 62 and 64. That signal is then transmitted to the output buffer amplifier 10, thence to the signal output line 284.

When the computer has elected to disable any one or more of the blocks of memory cells in the memory array, the block enable signal applied to the base of the transistor 262 is switched to a logical high. That logical high when compared with the reference signal of the base of the transistor 258 causes the transistor 258 to be switched off and the current flow is steered through the transistor 262. When the current flow is through the transistor 262, a logical high appears at the base of the transistor 274 of the output differential amplifier pair. Consequently, a logical low appears at the output terminal 284. So long as the block enable signal remains at a logical high, only zeroes will be read at the output terminal 284. When the block enable signal is at a logical low, the differential amplifier will respond, as before noted, to the existing status of the selected or addressed cell in the associated block of the memory array, when a logical high is applied to both the WD and NWD lines connected to the sense switch transistors 88 and 92.

When, on the other hand, the write pulse and the write amplifier 6 has been switched to a logical low, and the block elect signal is at a logical low, the write amplifier is in the condition, then, to write into the addressed cell of the block of the memory array. At the same time, however, the sense amplifier 8 will respond to the application of a data signal to the WD or NWD line to produce a corresponding signal at the output lead 284. Thus, if the write signal has been for a logical high at the WD line a corresponding low would appear at the NWD line. That differential signal, in addition to being written into the memory cell, would also be sensed by the sense amplifier to produce the logical high at the output line 284. On the other hand, if the write signal at the line WD has been for a logical low and a corresponding logical high at the line NWD, that signal would be written into the designated memory cell as well as being sensed by the sense amplifier to produce a logical low signal at the output line 284.

Figure 8:
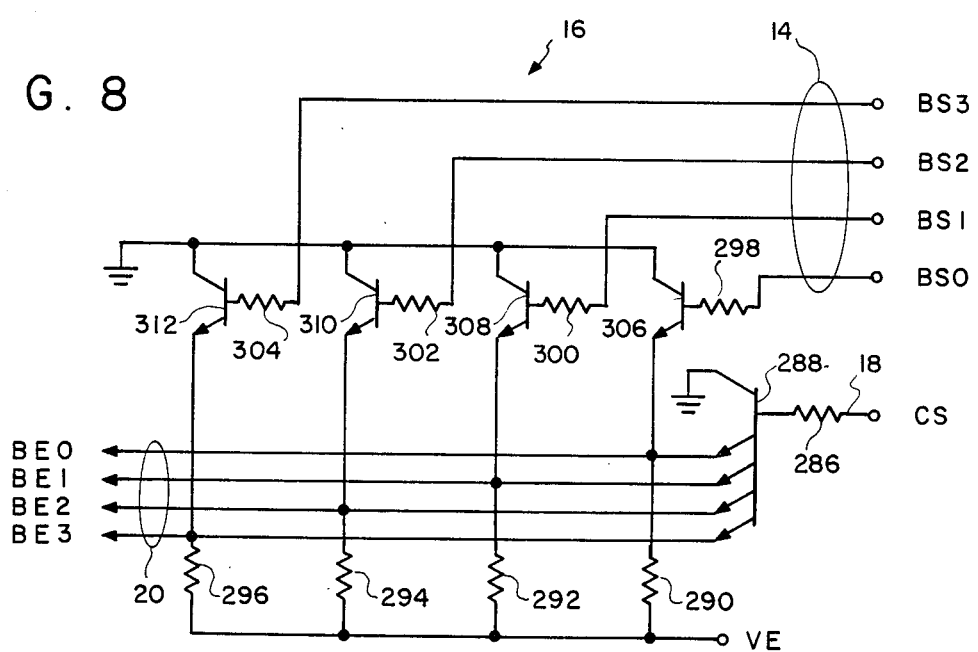

In FIG. 8, there is illustrated one embodiment of a circuit for effecting the block enable signal which, as has been mentioned, may be applied to control the operation of the write amplifier and the sense amplifier. In the circuit shown in FIG. 8, a chip select signal (CS) is applied from the line 18, through a resistor 286, to the base electrode of a multi-emitter transistor 288. The chip select signal is generated from the computer and enables the entire memory chip. In the illustrated embodiment, there are four emitters of the multiple emitter transistor 288. They are, of course, the equivalent of four individual transistors having the chip select signal applied to the base electrode of each. The collector electrode of the transistor 288 is connected to ground. Each of the emitters of the transistor 288 are connected, respectively, through individual load resistors 290, 292, 294 and 296 to a source of energizing voltage. A plurality of block select signals, in the illustrative embodiment, four herein designated as BS0, BS1, BS2 and BS3 are applied from the lines 14, through coupling resistors 298, 300, 302 and 304 to the base electrode of corresponding emitter follower transistors 306, 308, 310 and 312. These block select signals represent the control signals respectively for the four blocks of cells in the memory array. The emitter of each of the transistors 306, 308, 310 and 312 are connected respectively to one of the emitters of the transistor 288. The junction of the pairs of emitters are connected, respectively, to output lines herein designated, respectively, BE0, BE1, BE2, and BE3 and collectively as lines 20 (see FIG. 1). These output lines represent the block enable signals applied, respectively, to the block enable input of the corresponding four write amplifiers and the four sense amplifiers. The structure shown in FIG. 8 is, effectively, an ANDing circuit wherein the four block select signal are respectively ANDed with chip select signal. To enable any individual block of the memory array, both the chip select signal and the corresponding block select signal must be at a logical low.

Thus there has been provided, in accordance with the present invention, an improved sense amplifier for a computer memory unit which features an enhanced response characteristic as well as means for selectively blocking the output of the amplifier.

We claim:
1. A sense amplifier for a computer memory unit, said sense amplifier comprising:
 (a) an input stage differential amplifier means, having input terminals adapted to receive differential input signals and output terminals adapted to transmit first differential output signal, for generating said first differential output signals;
 (b) a second stage differential amplifier means, operatively connected to said input stage differential amplifier means, for generating second differential output signals in response to said first differential output signals;

(c) output amplifier means, operatively connected to said second stage differential amplifier means, for generating an output signal in response to said second differential output signals; and (d) feedback means, operatively connected to said input terminal and said output terminal of said input stage differential amplifier means, for providing a negative feedback loop of said input stage differential amplifier means to reduce the effective voltage swing of said differential input signals thereby enhancing the speed of response of said sense amplifier.

2. A sense amplifier, as set forth in claim 1, wherein said input stage differential amplifier means comprises:

(a) a first and a second transistor, each transistor having a base terminal, an emitter terminal, and a collector terminal, said first and second transistor connected in a differential amplifier configuration, the emitter terminals of said first and second transistor being operatively connected to a constant current source, and the collector terminals of said first and second transistor being operatively connected to a corresponding output terminal of said input stage differential amplifier means; and (b) a first and a second emitter follower, each emitter follower having an input terminal adapted to receive a respective differential input signal, and each emitter follower further having an output terminal operatively connected, respectively, to the base terminal of said first and second transistor.

3. A sense amplifier as set forth in claim 2 wherein said negative feed-back loop means includes a first resistor connected between the collector of said first transistor and the base of said first emitter follower transistor, and a second resistor connected between the collector of said second transistor and the base of said second emitter follower transistor.

4. A sense amplifier as set forth in claim 3 wherein said second stage differential amplifier means includes a controlled source of energizing current therefor and a selectively operable steering circuit means selectively de-energizing said second stage in response to a control signal.

5. A sense amplifier as set forth in claim 4 wherein said steering circuit means comprises a further differential amplifier for comparing said control signal with a fixed reference signal, said reference signal having a magnitude intermediate the extremes of said control signal, said further differential amplifier defining a first current path through the differential amplifier of said second stage when said control signal is of a magnitude less than that of said reference signal, and a second, or bypass, current path for said energizing current when said control signal is of a magnitude greater than that of said reference signal.

* * * * *